United States Patent [19]

Leiphart

[11] Patent Number: 5,985,102
[45] Date of Patent: Nov. 16, 1999

[54] KIT FOR ELECTRICALLY ISOLATING COLLIMATOR OF PVD CHAMBER, CHAMBER SO MODIFIED, AND METHOD OF USING

[75] Inventor: Shane P. Leiphart, Boise, Id.

[73] Assignee: Micron Technology, Inc., Boise, Id.

[21] Appl. No.: 08/907,116

[22] Filed: Aug. 6, 1997

Related U.S. Application Data

[63] Continuation-in-part of application No. 08/593,227, Jan. 29, 1996, abandoned, and a continuation-in-part of application No. 08/629,440, Apr. 8, 1996, Pat. No. 5,705,042.

[51] Int. Cl.⁶ .................................................. C23C 14/34
[52] U.S. Cl. ............................... 204/192.12; 204/192.17; 204/192.3; 204/298.06; 204/298.11; 438/584; 438/597
[58] Field of Search ........................... 204/192.12, 192.3, 204/298.11, 298.06, 192.17; 438/584, 597, 674, 675

[56] References Cited

U.S. PATENT DOCUMENTS

| | | | |
|---|---|---|---|
| 4,169,031 | 9/1979 | Brors | 204/298.11 |
| 5,223,108 | 6/1993 | Hurwitt | 204/192.12 |
| 5,330,628 | 7/1994 | Demaray et al. | 204/192.12 |
| 5,346,601 | 9/1994 | Barada et al. | 204/192.15 |
| 5,403,459 | 4/1995 | Guo | 204/192.32 |
| 5,409,587 | 4/1995 | Sandhu et al. | 204/192.12 |
| 5,431,799 | 7/1995 | Mosely et al. | 204/298.06 |
| 5,478,455 | 12/1995 | Actor et al. | 204/192.13 |
| 5,482,611 | 1/1996 | Helmer et al. | 204/298.17 |
| 5,527,439 | 6/1996 | Sieck et al. | 204/298.11 |
| 5,549,802 | 8/1996 | Guo | 204/298.11 |

FOREIGN PATENT DOCUMENTS 6-10125  1/1994  Japan .

OTHER PUBLICATIONS

Tetsuya et al., *Patent Abstracts of Japan*, vol. 18, No. 215 (C–1191), Publication No. 6–10125 (Jan. 18, 1994).

*Primary Examiner*—Rodney G. McDonald
*Attorney, Agent, or Firm*—Trask, Britt & Rossa

[57] ABSTRACT

A collimator is mounted within a sputter chamber and is interposed between a sputter target and a wafer to be coated with a thin film of the sputtered material. A shield extends around the perimeter of the volume between the collimator and the wafer. The collimator and shield of the present invention are preferably mounted within the sputter chamber in a manner so that they are electrically insulated from the chamber and able to take on a floating electrical potential associated with the potential of the plasma generated within the sputter chamber. A kit for simply and robustly effecting the mounting of the collimator and shield is disclosed. More uniform deposition and surface planarity of target material on the wafer are achieved with the floating collimator when employed with the floating shield structure.

23 Claims, 5 Drawing Sheets

KIT FOR ELECTRICALLY ISOLATING COLLIMATOR OF PVD CHAMBER, CHAMBER SO MODIFIED, AND METHOD OF USING

This application is a continuation-in-part of application Ser. No. 08/593,227 filed Jan. 29, 1996, abandoned, and a continuation-in-part of application Ser. No. 08/629,440 filed Apr. 8, 1996, now U.S. Pat. No. 5,705,042.

BACKGROUND OF THE INVENTION

1. Field of the Invention

This invention relates to a collimator for use in sputter deposition of films on semiconductor wafers, and a method for using the same. More specifically, the invention relates to the use of a collimator at a free-floating electrical potential, preferably in combination with a negative bias to the wafer, for enhanced step coverage of the wafer. In order to maintain the collimator and, optionally, lower shield at the free-floating potential in a manner suitable for effective and repeatable operation, a kit providing a modified support structure has been invented, as well as a deposition chamber so modified and a method of deposition.

2. State of the Art

Sputtering is a method of depositing thin metal and insulating films onto semiconductor wafers. The term "wafer" includes not only traditional wafer structures, but also other substrates exhibiting an outer layer of semiconductor material useful for formation of integrated circuits thereon, including without limitation so-called silicon-on-insulator, or "SOI", structures. The term sputtering describes a physical mechanism in which atoms are dislodged from the surface of a material by collision with high energy particles. Sputtering has become a widely utilized deposition technique for a variety of metallic films in semiconductor and integrated circuit (IC) fabrication, including aluminum, aluminum alloys, platinum, gold, tungsten, titanium and titanium:tungsten. Sputtering is also used in some applications to deposit molybdenum, Si, $SiO_2$ (silica glass), and refractory metal silicides, although CVD (chemical vapor deposition) or evaporation may be more frequently used for deposition of such materials.

Sputtering takes place in an evacuated chamber. In general, the sputtering process may be summarized in four steps: 1) ions are generated and directed at a target; 2) the ions sputter (dislodge) target atoms; 3) the ejected (sputtered) atoms are transported to the substrate, where 4) they condense and form a thin film.

The energetic particles used to strike target materials to be sputtered in sputter deposition systems are generated by glow-discharges, a glow-discharge being a self-sustaining type of plasma. A plasma may be defined as a partially ionized gas containing an equal number of positive and negative charges, as well as some other number of non-ionized gas particles. Generally, a noble gas, usually argon (although at least neon and xenon have also been employed) comprises the plasma.

One drawback of sputtering is the difficulty in achieving conformal coverage deep within high aspect ratio features on semiconductor wafers. In sputtering, the trajectory of the atomic material sputtered from the target depends in significant part upon the incident angle of the bombarding atom. Accordingly, atoms directed towards the wafer surface come from varying angles, only a relatively small portion of which arrive at the wafer surface in a substantially perpendicular angle in comparison to the other angled atoms. Atoms reaching the substrate surface via non-perpendicular trajectories provide an undesired drawback of not conformally coating deep within high aspect ratio features.

To overcome such a drawback, a device known as a collimator is used. A collimator typically comprises a disk-shaped object having a plurality of holes or openings provided therethrough. The collimator functions effectively as a filter, essentially restricting the path of the sputtered particles to the desired perpendicular or near-perpendicular and allowing only these particles to pass through the collimator and coat the substrate surface, which is normally a semiconductor wafer. This path restriction to substantially perpendicular angled particles results in a more conformal deposition within high aspect ratio features than is possible when a collimator is not used.

Another method used to improve step coverage within contacts is to increase the acceleration of ions from the discharge toward their surfaces. The impinging ions transfer energy to surface atoms, and cause them to be transported to the sidewalls of steps, where they accumulate and locally increase film thickness.

One aspect of the use of a prior art collimator is that it is mounted in a sputter chamber in such a manner that the collimator and the chamber are both grounded. This grounded configuration causes the collimator to behave as a plasma barrier in both directions. The parent and grand-parent applications hereto disclose apparatus and method of using the same that allow improved conformal coverage deep within high aspect ratio features on semiconductor wafers and IC's. This result was achieved by providing a collimator and method of using the same wherein the collimator is not an electrical plasma barrier.

The parent and grand-parent application hereto also disclose the use of an rf bias to the substrate (wafer) for enhanced attraction of plasma ions for reactive sputtering as well as control or inhibition of "pinch off" of high aspect ratio features by the deposited film of target material, wherein material deposited at the upper extent of recessed features effectively precludes coverage of the bottoms thereof.

As taught by the referenced prior applications, a collimator is mounted within a sputter chamber and is interposed between a sputter target and a semiconductor wafer to be coated with a thin film of the sputtered material. The collimator is mounted within the sputter chamber in an insulated manner so that the collimator is electrically isolated from the chamber and the collimator is able to take on a floating electrical potential of or associated with the potential of the plasma generated within the sputter chamber.

In practicing the above-referenced invention, however, the inventor herein has recognized that it is difficult to provide a collimator isolator structure which is robust enough to withstand repeated sputtering operations without shorting and without accumulating deposits of target material in undesired areas between the source and the collimator. In addition, the inventor has recognized the merits of extending electrical isolation of the collimator to the shield below the collimator located between the collimator and the wafer), in contrast to the grounded lower shields of the prior art.

SUMMARY OF THE INVENTION

The present invention comprises a kit for electrically isolating a collimator and, optionally, the lower shield of a plasma vapor deposition chamber, a chamber so modified, and a method of using the modified chamber.

The kit comprises an anodized aluminum receiving ring, which is secured to the grounded source adaptor of the chamber surrounding a target bore in the adaptor, through which particles of target material travel toward the wafer or other semiconductor substrate. A collimator adaptor ring, which may be formed of stainless steel, includes a radially outwardly projecting annular flange, the undersurface of which rests on a radially inwardly-extending annular flange or lip of the receiving ring. The anodized receiving ring surface electrically isolates the adaptor ring, and thus the collimator carried thereby suspended in alignment with the source adaptor target bore, from the grounded source adaptor.

An annular shield, commonly termed a "top hat" in the art, which extends below the collimator and laterally around the chamber volume between the collimator and the wafer or other semiconductor substrate surface may also be optionally electrically isolated from the source adaptor by suspending it from a mounting structure, such as a shield mounting ring, suspended from the collimator adaptor ring. Electrical isolation of the shield, which then is maintained at a floating potential like the collimator, has been demonstrated to broaden erosion at the outer lateral periphery of the wafer or other substrate surface, reduce erosion at the inner region thereof, and enhance uniformity and increase planarity of the target material film deposited thereon when used in conjunction with the electrically isolated collimator. Of course, the shield may alternatively be directly connected to the source adaptor if desired, as described below.

DETAILED DESCRIPTION OF THE ILLUSTRATED EMBODIMENT

Figure 1:
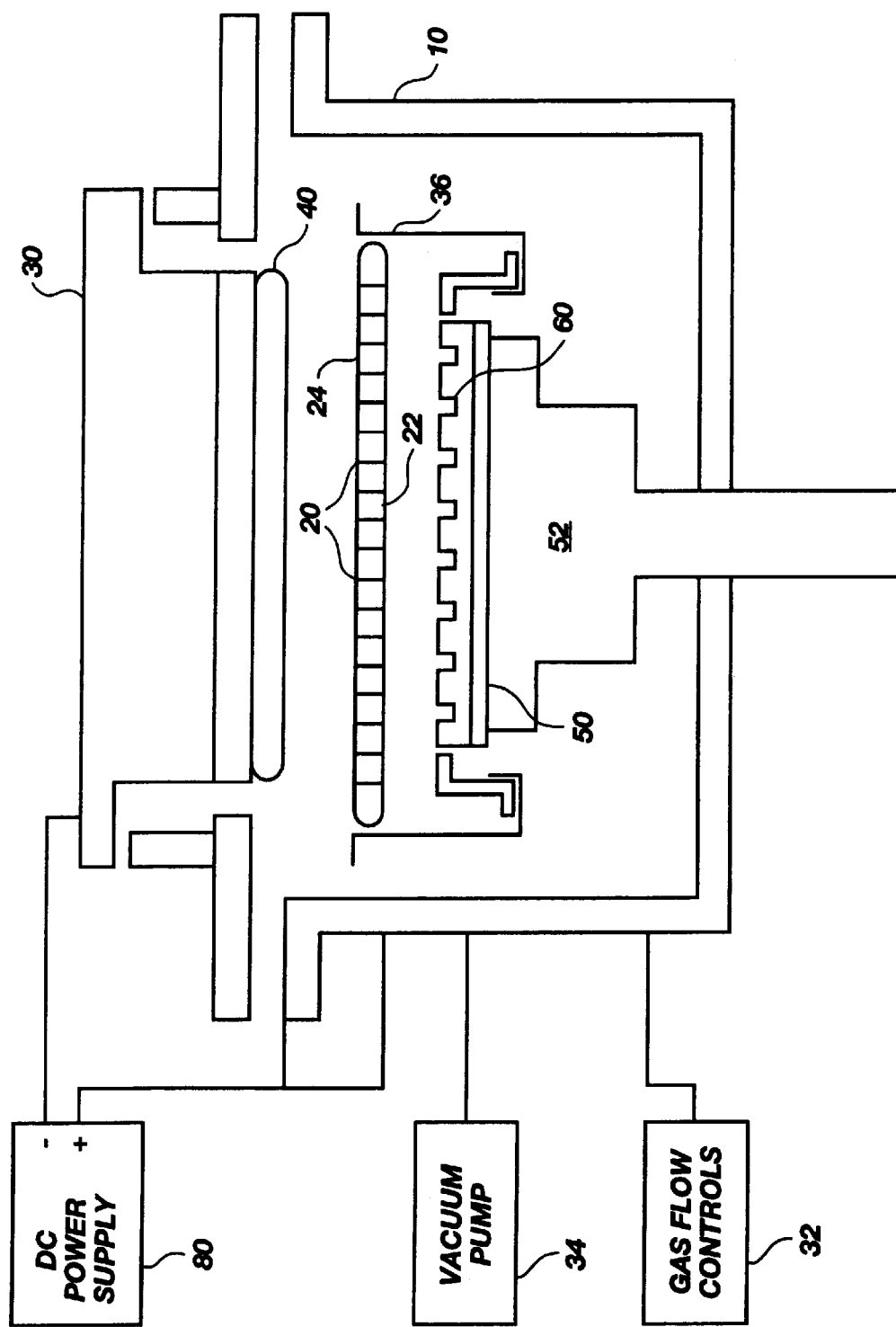
FIG. 1 is a schematic cross-sectional view of a prior art having a collimator grounded to the sputtering chamber.

FIG. 1 shows a sputtering chamber 10 equipped with a collimator 20, in a typical prior art configuration. Collimator 20 is located between target mount 30, holding substantially planar target 40, and substrate or wafer 50. Wafer 50 includes a plurality of features 60 which are to be filled with sputtered particles deposited onto wafer 50 during sputter coating. Collimator 20 is preferably machined out of a machinable metal, such as aluminum, copper, stainless steel or titanium, though any suitable material may also be used. The particular material chosen will depend upon the material being sputtered, and the respective adherence characteristics of the two materials.

Other conventional parts of the sputter apparatus include a gas supply and flow controls 32 to control the gas flow into chamber 10 and an exhaust vacuum pump 34 which creates a vacuum in chamber 10 during processing of substrate wafer 50. A shield 36 surrounds wafer 50.

Collimator 20 includes flat member 22 with a plurality of substantially parallel passages 24 machined therethrough. Collimator 20 is mounted between target 40 and wafer 50. Generally collimator 20 is mounted approximately halfway between target 40 and wafer 50, but placement of collimator 40 is variable depending upon the particular fabrication objectives.

Figure 2:
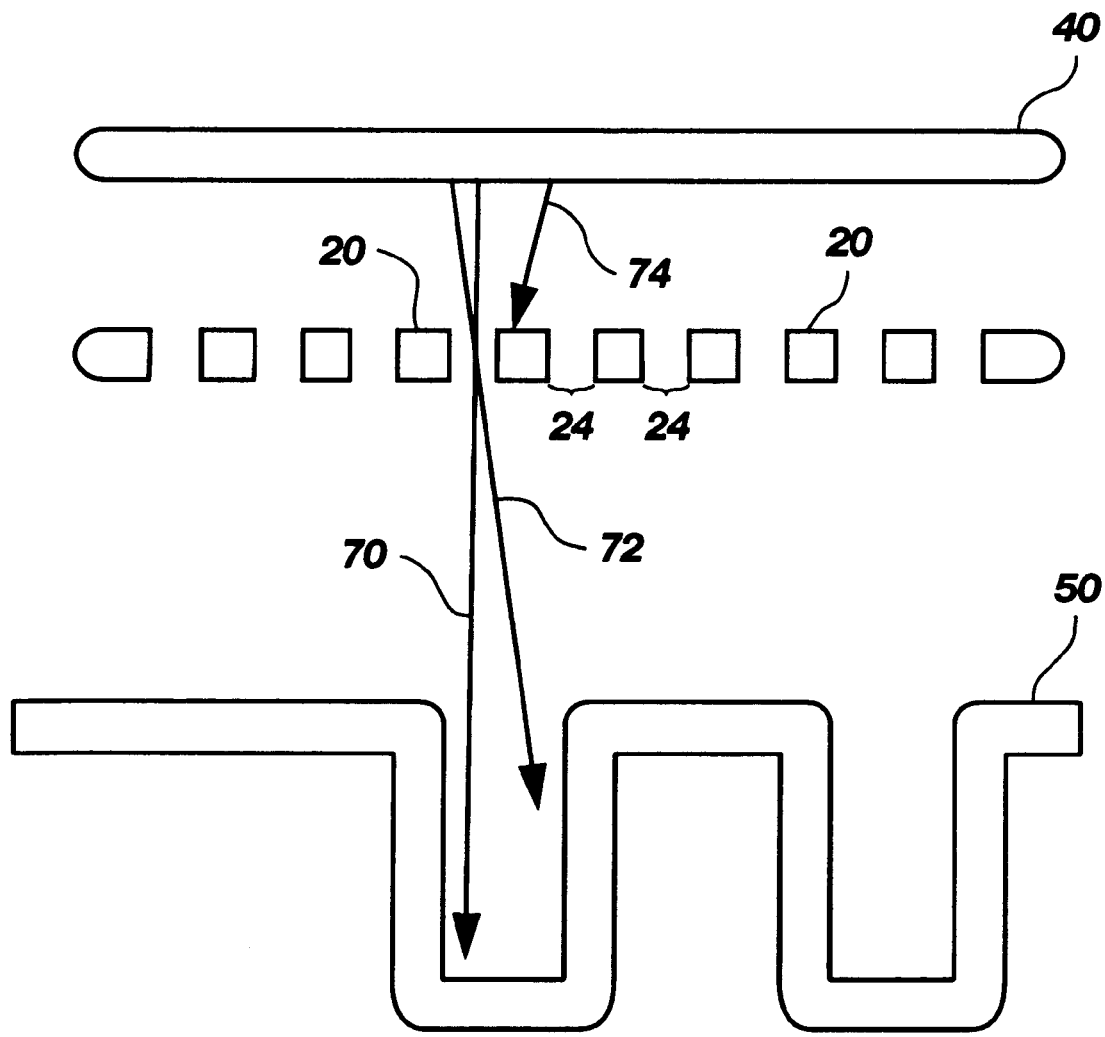
FIG. 2 is a schematic cross-sectional view showing the function of a typical collimator.

The function of collimator 20 can be demonstrated by exemplary directional arrows 70 and 72, in FIG. 2. Directional arrows 70 and 72 depict potential trajectories of travel by sputtered particles as they progress from target 40 to wafer 50. The path of arrow 70 is the ideal trajectory and is a direct, or 90° perpendicular, route from target 40 to wafer 50, through passage 24, and is not directionally influenced by the presence of collimator 20. In the case of a sputtered particle traveling along trajectory of arrow 72, however, the particle is guided unimpeded through one of passages 24 and deposits upon wafer 50. In the case of arrow 74, the trajectory follows an undesirable path and is prevented by collimator 20 from reaching the surface of wafer 50.

During a normal sputtering cycle, as shown in FIG. 1, target mount 30 is connected to power supply 80, establishing a voltage potential between grounded chamber 10 and target 40, mounted onto target mount 30. The negative terminal of power supply 80 is connected to target mount 30 and the positive terminal is grounded to chamber 10. In a typical configuration, as is well known in the art, collimator 20 is mounted in chamber 10 in such a manner that it is grounded to chamber 10. During sputtering, support 52, having substrate 50 thereon, is moved upwardly into a processing position in chamber 10. Positive ions in the plasma generated from the gas resident within chamber 10 are drawn toward and strike or bombard negatively-charged target 40, dislodging or sputtering portions or particles of the target material, which particles are accelerated toward substrate 50, which may be optionally negatively biased.

Figure 3:
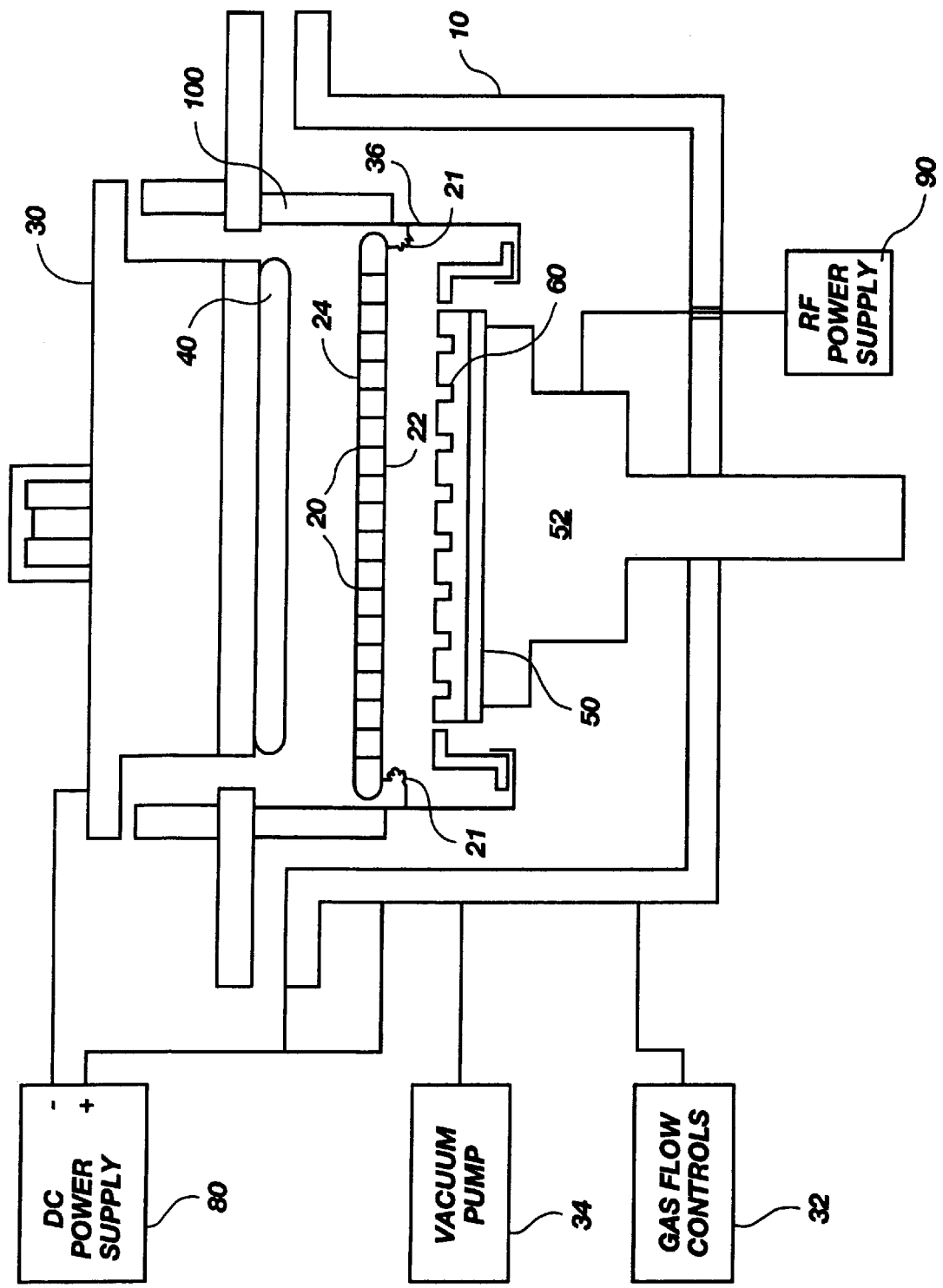
FIG. 3 is a schematic cross-sectional view of a sputtering chamber with collimator mounted in an insulated manner in accordance with the present invention.

FIG. 3 is a schematic view of a sputtering chamber 10 modified in accordance with the present invention having collimator 20 mounted therein between target mount 30 and substrate 50. Collimator 20 for the present purposes is mounted within chamber 10 in an insulated manner so that the collimator is electrically insulated or isolated from the chamber and the collimator is able to take on a floating electrical potential associated or related to that of the plasma generated within chamber 10. In one embodiment, collimator 20 is mounted in chamber 10 using high voltage ceramic insulators 21, but any appropriate means of insulating collimator 20 from chamber 10 can be used. In practice, ceramic insulators have proven to present heat transfer problems between the collimator 20 and the structure supporting ceramic insulators 21, as well as mechanical reliability problems.

Target 40 is maintained at a negative, preferably dc, bias during sputtering, while substrate 50 is maintained at a negative potential through, preferably, an rf voltage as shown at 90.

Other parts of sputter chamber 10 illustrated in FIG. 3 are conventional and the same numerals are used as for similar parts in FIGS. 1 and 2.

Since in the prior art, as in FIG. 1, collimator 20 is grounded to chamber 10, collimator 20 becomes a barrier to plasma passage in both directions.

In the sputter deposition of thin metal and insulating films onto semiconductor wafers, it is desired that the thin films maintain a uniform thickness and freedom from cracks or voids. As sputtered thin films cross steps that occur on the surface of the underlying substrate, they may suffer unwanted deviations from the ideal, such as thinning or cracking. A measure of how well a film maintains its nominal thickness is referred to as the step coverage of the film, and is expressed as the percentage of the nominal thickness that occurs at the step.

Step coverage of 100% is ideal, but each process is normally specified by a lesser minimum value that is acceptable for a given application. The height of the step and the aspect-ratio of the feature being covered also determine the expected step coverage. That is, the greater the height of the step, or the aspect ratio (i.e., the height-to-spacing ratio of two adjacent steps or, with specific reference to holes or vias in a substrate, the depth-to-width ratio), the more difficult it is to cover the step without thinning of the film, and hence the worse the expected step coverage.

There is particular difficulty in obtaining coverage of the lower (e.g., deeper) regions of high aspect-ratio features, over and above the above-mentioned difficulties. This is the result of a phenomenon termed "pinch off", wherein target material deposited at the top or within the mouth of the recessed feature accumulates and narrows the opening through which target material may reach the bottom of the feature. Prior art collimators have purportedly reduced pinch off to some extent. However, the continued reduction in size (especially aperture width) of surface features on a wafer, in combination with increased relative depth of apertures necessitated by the large number of layers employed in state-of-the-art semiconductors, presents increasing step coverage problems even with collimator-reduced pinch off. While high aspect ratio collimators may be used to address this problem, the "over-filtration" of particles attendant to the use of such collimators greatly protracts sputtering times and increases costs for a given film thickness and step coverage.

One method to improve coverage is to increase the acceleration of the plasma ions. The impinging ions from the plasma transfer energy to surface atoms, and cause them to be transported to the sidewalls of steps, where they accumulate and locally increase film thickness along with re-sputtering from the wafer surface.

An advantage of this invention is that by electrically isolating collimator 20, plasma passes through it with great ease relative to grounded chamber 10, resulting in substantially enhanced plasma concentration or density between collimator 20 and substrate or wafer 50. Because of this, wafer 50 experiences a much higher flux of ions from the plasma. Certain types of sputtering, for example reactive sputtering, involve the incorporation of components of the sputtering gas into the film. That is, in some circumstances, the film reacts with all or some of the sputtering gas and forms a compound film with it. The degree or rate of reaction is aided by ion bombardment and having the reaction components in ionized or excited form.

An insulated collimator, as with this invention, allows for ionized gas components to exist in significant concentrations near the wafer. The bombardment of these ionized gas components will allow for any chemical reactions with the film to proceed faster (i.e. lower the activation energy for reaction). This is important in many cases of reactive sputtering where the partial pressure of the reactive component needs to be kept to a minimum. It is well known that, at some partial pressures, the sputtering target surface will be reacted. This is almost always accompanied by a dramatic drop in deposition rate. It is desirable to keep the partial pressure low enough to have an unreacted target surface but still have enough of a concentration of reactive gas to produce the desired film. Having ionized reactive species will decrease the reaction activation energy and produce the desired film at a lower partial pressure than in the case of a grounded collimator.

Also, because an insulated collimator allows for significant plasma penetration relative to a grounded one, the effects of application of a negative, preferably by rf, electrical bias to wafer 50 will be enhanced. Electrical biasing of wafer 50 is a common technique used to modify film properties. This includes film stress, step coverage, morphology and composition, to name a few. However, unless plasma exists near the biased wafer features, there will be little or no ion contact with the wafer and minimal enhancement of film properties. Prior art sputtering apparatus and structures, through use of a grounded collimator, effectively precluded a substantial plasma presence in the area between the collimator and the wafer. The present invention, with collimator 20 maintained at its floating potential, provides for a substantially enhanced presence of plasma ions attracted (and accelerated) by the negative potential of the rf-biased wafer.

In addition to the foregoing advantages of combining an electrically isolated collimator with a negatively-biased wafer, it has been recognized by the inventor that the rf bias of the wafer or substrate, in combination with the enhanced presence of plasma ions in proximity to the wafer, provides for reduction or control of the aforementioned "pinch off" of high aspect ratio features by sputtering of excess target material accumulating in the pinch off region, thus preventing premature narrowing or even closure of the top or entry area of a feature which would preclude insufficient bottom coverage of that feature.

A kit for modifying conventional plasma vapor deposition chambers has been developed by the inventor, in order to provide an effective, robust, relatively simple structure for effecting the aforementioned electrical isolation of the collimator, as well as optional isolation of the shield (previously referenced herin as 36) extending about the volume between the collimator 20 and the wafer support 52. While the kit has specific applicability to an Applied Materials, Inc. (Santa Clara, Calif.) Endura 5500 physical vapor deposition tool, the same kit, with dimensional and accessory variations, may be employed to accommodate the design of PVD tools offered by other vendors, such as Varian Associates, Inc. of Palo Alto, Calif.

Figure 4:
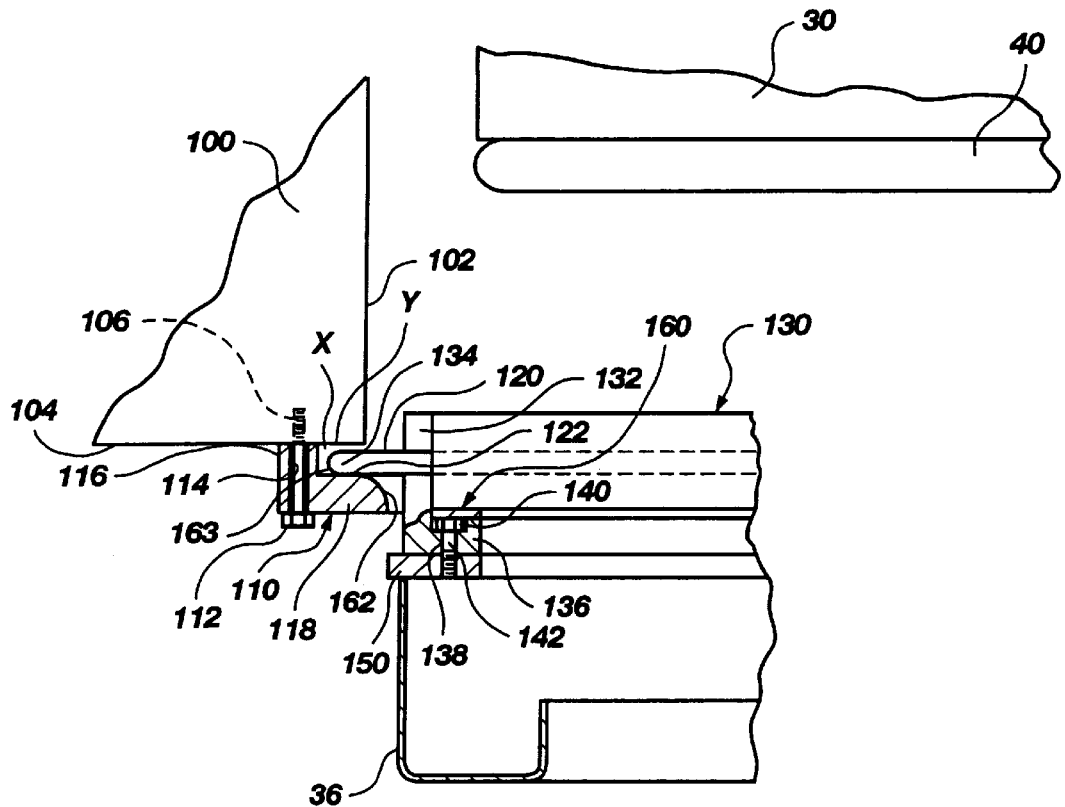
FIG. 4 is an enlarged, schematic, partial cross-sectional view of a portion of a source adaptor with one embodiment of the electrical isolation kit of the invention installed thereon.
Figure 7:
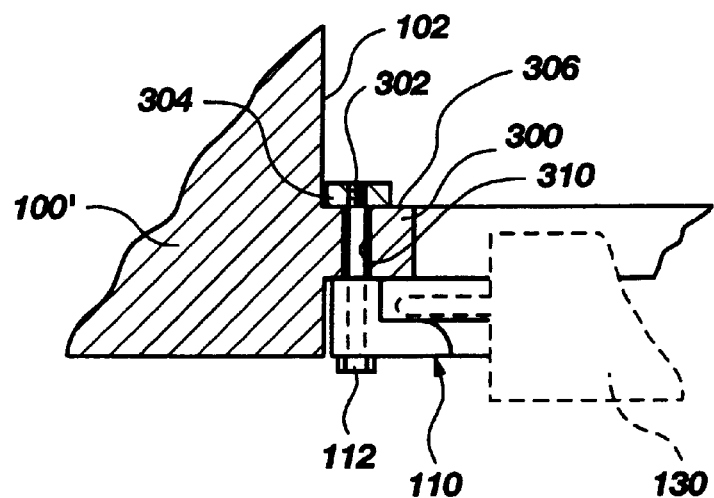
FIG. 7 is an enlarged, schematic, partial cross-sectional view of a portion of a source adaptor depicting a mounting arrangement for the kit of the present invention as an alternative to the arrangement of FIG. 3.

FIG. 4 shows an enlarged view of one side of a lower portion of source adaptor 100 (see FIG. 3 for general positioning of source adaptor 100 within chamber 10), within which target 40 at a negative potential is disposed from target mount 30 in electrical isolation from source adaptor 100 and grounded chamber 10, as schematically shown in FIG. 3. Source adaptor 100 is water-cooled with circulating channels therethrough, as known in the art, and defines an internal, circular target bore 102 above lower surface 104, which includes a plurality of spaced, threaded holes 106 formed therein at intervals around target bore 102. An insulated aluminum collimator receiving ring 110, which may be comprised of anodized 6061-T6 aluminum, is secured, as by bolts 112 extending through bores 114 and threaded into adaptor threaded holes 106 on the lower surface 104 of source adaptor 100. Alternatively, in another source adaptor configuration 100', bolts 112 may extend through unthreaded bores 310 in a flange 300 extending radially inwardly in target bore 102 (see FIG. 7) and into threaded apertures 302 bored and tapped into a support ring 304 resting on the upper surface 306 of flange 300.

Collimator receiving ring 110 comprises an outer wall 116 through which bores 114 extend, and an annular flange or lip 118 extending radially inwardly from wall 116 at the lower extent thereof The outer surface of the collimator receiving ring 110, including the interior of bores 114, is clear, hard anodized, preferably to a thickness or depth on the ring surface of about 6 mils (0.006 inch). Thus, ring 110 and components suspended therefrom are electrically isolated from grounded source adaptor 100.

A stainless steel collimator adaptor ring 130 is disposed within the inner surface 120 of wall 116, and rests on upper surface 122 of flange 118. Collimator adaptor ring 130 may be formed of 316 stainless steel, and includes a circular, vertical wall portion 132 from which annular flange 134 extends radially outwardly over flange 118 of collimator receiving ring 110, by which adaptor ring 130 is suspended from the former. The outer radius of annular flange 134 is less than the radius of inner wall surface 120 by a horizontal distance X, and the vertical distance (height of wall surface 120) between upper flange surface 122 of receiving ring 110 is greater than the thickness of flange 134 by a vertical distance Y, according to design considerations set forth below. At the bottom of wall portion 132 of adaptor ring 130, annular lip 136 extends radially inwardly. Holes 138 are formed through lip 136 at circumferential intervals, holes 138 being topped by enlarged bores 140 for receiving the heads of bolts 142 extending downwardly through holes 138 and through shield (commonly referred to as a "top hat") mounting ring 150, from which shield 36 welded thereto is suspended. A bolt head cover ring 160 lies over the heads of bolts 142, and collimator 20 (not shown in FIG. 4) rests on cover ring 160. Cover ring 160 is significant in protecting the heads of bolts 142 from deposition of target material; otherwise, the bolts 142 might become sealed with deposited target material to the collimator adaptor ring 130, preventing their removal when desired.

Referring to distances X and Y as shown in FIG. 4, it will be appreciated that each should be minimized insofar as is possible while accommodating heat-induced expansion of receiving ring 110 and adaptor ring 130 to prevent contact and consequent potential for binding and warping of the two elements, as well as destruction of the anodized surface on wall 116 from such contact. Distance X is minimized in order to maximize the mutual horizontal, annular contact surface area between flanges 118 and 134 to maximize heat transfer therebetween. Distance Y is minimized in order to preclude, to the extent possible, entry of target material between lower surface 104 of source adaptor 100 and flange 134 of adaptor ring 130, in order to reduce the possibility of shorting the collimator 20 to ground (source adaptor 100) through adaptor ring 130.

Further, it will be noted that the edge or corner surfaces of receiving ring 110 and adaptor ring 130 which lie in close physical proximity have been rounded, as at 162 and 163, to minimize localized electrical field strength and thus reduce the likelihood of breaking down the surface anodization of receiving ring 110. It is noted that anodization has been demonstrated to break down above certain differential voltage levels. As the collimator lies at a floating voltage potential (typically 30 to 40 volts) attributable to the plasma potential environment rather than at ground, this design feature is of some significance in achieving commercially-viable longevity of the collimator and shield support structure.

Figure 5:
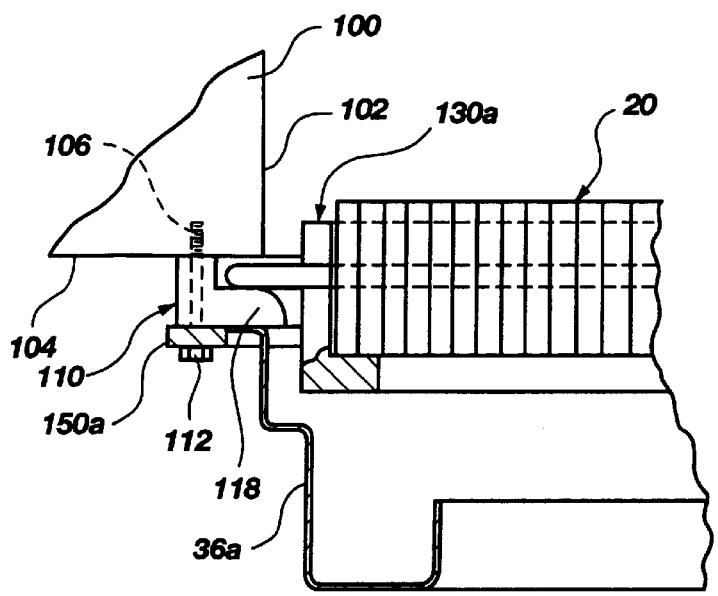
FIG. 5 is an enlarged, schematic, partial cross-sectional view of a portion of a source adaptor with another embodiment of the electrical isolation kit of the invention installed thereon and with a collimator in place.

It will be appreciated from the foregoing description that shield 36 is electrically isolated from source adaptor 100 in this embodiment, since it is suspended from adaptor ring 130. In the embodiment of FIG. 5, wherein previously-described features are identified by the same reference numerals, shield 36 is grounded by its direct connection to source adaptor 100 by bolts 112 secured thereto. Collimator 20 carried by receiving ring 130a (modified by deletion of bolt holes 138) resting on flange 118 of adaptor ring 110, remains electrically isolated.

Figure 6:
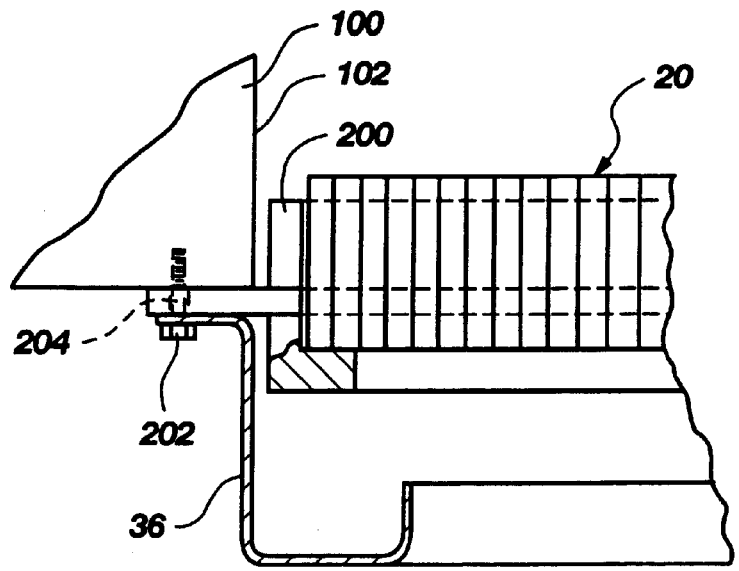
FIG. 6 is an enlarged, schematic, partial cross-sectional view of a portion of a source adaptor with a prior art collimator and shield suspension structure in place.

By way of structural comparison, FIG. 6 illustrates the prior art structure for suspending collimator 20, wherein a stainless steel collimator adaptor ring 200, as well as shield 36, is directly bolted to source adaptor 100 by bolts 202 extending through holes 204. A variation of this design intended to electrically isolate collimator 20 while providing adequate conductive cooling for collimator 20 was attempted by the inventor, using a collimator adaptor ring 200 formed of aluminum with an anodized exterior surface. However, mechanical stresses in combination with thermal cycling caused structural failure of the relatively frail aluminum ring, and the ease with which the anodizing chipped off the edges and interior of the holes 204 during installation and removal of collimator 20 often caused shorting of the collimator to ground, thus rendering the structure inoperable in terms of the present invention for any extended duration. While the anodization on the interior of bores 114 of receiving ring 110 may also chip, this is of no significance as the anodizing on the upper surface 122 of flange 118 maintains its integrity.

It has been ascertained that the structure of FIG. 4 provides operational advantages insofar as deposition of the target material is concerned. Specifically, the use of an electrically isolated or "floating" shield 36 has been observed to improve the uniformity or planarity of target material deposition on the wafer 50 in comparison to results achieved with a floating collimator in combination with a grounded shield. This appears to be due to an increase or extension of erosion of the wafer material toward the outer periphery of the exposed wafer surface, and a decrease of such erosion in the central region of the wafer.

While there is shown and described the preferred embodiment of the invention, it is to be distinctly understood that this invention is not limited thereto but may be variously embodied to practice within the scope of the following claims.

What is claimed is:

1. An apparatus for sputter deposition of a material on a semiconductor wafer, comprising:

a grounded chamber adapted for creation of a vacuum therein and provided with a supply of an ionizable gas;

a negatively-biased target of said material disposed in said chamber;

a semiconductor wafer support disposed in said chamber spaced from said target;

a collimator interposed between said target and said wafer support; and structure for electrically isolating said collimator from said grounded chamber, said structure for electrical isolating including an outer receiving member including at least an electrically non-conductive surface portion and secured to a grounded structural element of said chamber, and an inner collimator adaptor member supporting said collimator and borne on said electrically non-conductive surface portion of said outer receiving member.

2. The apparatus of claim 1, wherein said outer receiving member comprises an aluminum receiving ring including a wall portion having a radially inwardly-extending, substantially annular flange projecting therefrom, said at least an electrically non-conductive surface portion comprising anodization extending at least along an upper annular surface of said annular flange.

3. The apparatus of claim 2, wherein said inner collimator adaptor member comprises an electrically conductive adaptor ring including an adaptor ring wall portion defining a collimator receiving cavity therewithin and a radially outwardly-extending, substantially annular adaptor ring flange projecting therefrom, said adaptor ring flange resting upon said at least an electrically non-conductive surface portion of said receiving ring flange.

4. The apparatus of claim 3, further including an annular, electrically conductive shield extending about a chamber volume located between said collimator and said semiconductor wafer support, said annular shield being suspended from said adaptor ring.

5. The apparatus of claim 4, further including a shield mounting ring at an upper extent of said shield, said shield mounting ring being secured to said adaptor ring.

6. The apparatus of claim 5, wherein said adaptor ring further includes a substantially annular lip projecting radially inwardly from said adaptor ring wall portion, said shield mounting ring is secured to said lip by bolts extending downwardly through said lip, and further including a cover ring disposed over said bolts.

7. The apparatus of claim 3, further including an annular, electrically conductive shield extending about a chamber volume located between said collimator and said semiconductor wafer support, said annular shield being suspended from said structural element of said grounded chamber in electrical communication therewith.

8. The apparatus of claim 2, wherein said anodization is of a thickness of about 6 mils.

9. The apparatus of claim 8, wherein said wall portion of said aluminum receiving ring includes bolt holes extending therethrough, said aluminum receiving ring is secured to said structural element of said grounded chamber by bolts extending through said bolt holes and into said member, and the entire exterior surface of said aluminum receiving ring is anodized.

10. A method for sputter deposition of a material on a semiconductor wafer, comprising:

providing a semiconductor wafer in a chamber, at least a portion of which chamber is at a first potential;

providing a source of said material for said deposition spaced from said wafer in said chamber;

sputtering said material with a gas plasma resident in said chamber to produce sputtered material particles; collimating trajectories of said sputtered material particles to features on a surface of said wafer in electrical isolation from said first potential to form a film of said material on said wafer; and substantially laterally enclosing a chamber volume between a location of said collimating and said semiconductor wafer with a conductive shield in electrical isolation from said first potential.

11. The method of claim 10, further comprising maintaining said source of said material at a second potential different from said first potential, and maintaining said wafer at a third potential different from said first potential.

12. The method of claim 11, wherein said first potential comprises ground.

13. A method for sputter deposition of a material on a semiconductor wafer including aspect-ratio features on a surface thereof, comprising:

providing a chamber having at least a portion thereof at a first potential;

providing a semiconductor wafer including said aspect-ratio features within said chamber at a second potential different from said first potential;

providing a source of said material for said deposition spaced from said wafer in said chamber;

sputtering said material with a gas plasma resident in said chamber to produce particles of sputtered material;

collimating trajectories of said particles of sputtered material to features on the surface of said wafer to form a film of said material on said wafer;

substantially laterally enclosing a chamber volume between a location of said collimating and said semiconductor wafer with a conductive shield in electrical isolation from said first and second potentials; and substantially reducing pinch off of said material proximate entry regions to said aspect ratio features with said second potential.

14. The method of claim 13, wherein said pinch off is substantially reduced through sputtering of deposited material from said entry regions attributable to said second potential.

15. The method of claim 14, further including collimating said trajectories of sputtered material particles in electrical isolation from said first and second potentials.

16. The method of claim 15, further including maintaining said gas plasma at a potential and maintaining said conductive shield at a floating potential.

17. A method for sputter deposition of a material on a semiconductor wafer including recesses in a surface thereof, comprising:

providing said semiconductor wafer in a chamber to produce sputtered material particles;

providing a source of said material for said deposition spaced from said wafer in said chamber;

sputtering said material with a gas plasma resident in said chamber to produce sputtered material particles;

maintaining said gas plasma at a potential; and collimating trajectories of said sputtered material particles to features on the surface of said wafer at a potential associated with said potential of said gas plasma to form a film of said material on said wafer and within said recesses while substantially surrounding a volume in said chamber between a location of said collimating and said surface of wafer with a conductive shield member at a potential associated with said potential of said gas plasma.

18. The method of claim 17, further including maintaining said wafer at a potential different from said potential of said gas plasma, and sputtering portions of said film of said material from said wafer to enhance step coverage of said wafer.

19. The method of claim 18, further including achieving said enhanced step coverage by inhibiting pinch off at entry regions of recesses in said surface of said wafer.

20. A kit for modifying an apparatus for sputter deposition of a material on a semiconductor wafer, said apparatus comprising a grounded chamber adapted for creation of a vacuum therein and provided with a supply of an ionizable gas, a negatively-biased target of said material disposed in said chamber, a semiconductor wafer support disposed in said chamber spaced from said target and a collimator interposed between said target and said wafer support, said kit comprising:

an aluminum receiving ring having an anodized exterior surface and including a receiving ring wall portion having a radially inwardly extending receiving ring flange projecting therefrom, said receiving ring wall portion including a plurality of bolt holes therethrough for receiving bolts to secure said receiving ring to a member of said grounded chamber; and a stainless steel adaptor ring including an adaptor ring annular wall portion having an outer diameter less than an inner diameter of said receiving ring flange and defining a cavity for receiving said collimator therein, said adaptor ring wall portion further having a radially inwardly extending lip at a lower portion thereof and a radially outwardly extending adaptor ring flange projecting therefrom, an outer diameter of said adaptor ring flange being less than a diameter defined by a radially inner surface of said receiving ring wall portion.

21. The kit of claim 20, wherein said adaptor ring includes a plurality of adaptor ring bolt holes extending through said lip, and further including:

an annular shield member having a mounting ring at an upper extent thereof, said mounting ring including tapped mounting ring bolt holes therein alignable with said plurality of adaptor ring bolt holes for securing said shield member to said lip by bolts extending thorough said plurality of adaptor ring bolt holes and into said tapped mounting ring bolt holes; and a cover ring sized to fit within a diameter defined by an inner surface of said adaptor ring wall portion and over heads of bolts securing said mounting ring to said lip.

22. The kit of claim 20, wherein an anodization layer is present on said exterior surface of said receiving ring and is approximately 6 mils in thickness.

23. The kit of claim 20, wherein said anodized exterior surface of said receiving ring includes bore walls of said plurality of bolt holes.

* * * * *

UNITED STATES PATENT AND TRADEMARK OFFICE
CERTIFICATE OF CORRECTION

PATENT NO.   : 5,985,102
DATED        : November 16, 1999
INVENTOR(S)  : Shane P. Leiphart It is certified that error appears in the above-identified patent and that said Letters Patent is hereby corrected as shown below:

Column 1,
Line 32, change "sputtering" to -- "sputtering"

Column 3,
Line 34, before "having" at the beginning of line insert -- sputtering chamber --

Column 4,
Line 2, after "sputtered" delete ","

Column 6,
Line 3, delete "," after "that"
Line 4, delete "," after "pressures"
Line 46, change "herin" to -- herein --

Column 7,
Line 11, after "thereof" insert -- . --

Column 8,
Line 13, after "110" delete ","
Line 64, change "electrical" to -- electrically --

Column 9,
Line 11, after "said" insert -- substantially --
Line 45, change "member" to -- structural element --
Line 46, change "the" to -- an --

Column 10,
Lines 39-40, after "chamber" delete "to produce sputtered material particles"
Line 53, after "of" insert -- said --

UNITED STATES PATENT AND TRADEMARK OFFICE
CERTIFICATE OF CORRECTION

PATENT NO. : 5,985,102
DATED : November 16, 1999
INVENTOR(S) : Shane P. Leiphart It is certified that error appears in the above-identified patent and that said Letters Patent is hereby corrected as shown below:

Column 12,
Line 9, change "thorough" to -- through --.

Signed and Sealed this

Twenty-ninth Day of July, 2003

JAMES E. ROGAN
*Director of the United States Patent and Trademark Office*